United States Patent
Whitmore et al.

(10) Patent No.: US 12,319,049 B2
(45) Date of Patent: Jun. 3, 2025

(54) DEPOSIT LEVELLING

(71) Applicant: ASMPT SMT Singapore Pte. Ltd., Singapore (SG)

(72) Inventors: Mark Alfred Whitmore, Broadstone (GB); Jeffrey David Schake, Apalachin, NY (US)

(73) Assignee: ASMPT SMT SINGAPORE PTE. LTD., Singapore (SG)

( * ) Notice: Subject to any disclaimer, the term of this patent is extended or adjusted under 35 U.S.C. 154(b) by 128 days.

(21) Appl. No.: 17/983,558

(22) Filed: Nov. 9, 2022

(65) Prior Publication Data

US 2023/0146845 A1    May 11, 2023

(30) Foreign Application Priority Data

Nov. 10, 2021 (GB) .................................. 2116126

(51) Int. Cl.
| | | |
|---|---|---|
| *B41F 15/44* | (2006.01) | |
| *B41F 23/04* | (2006.01) | |
| *H01L 23/00* | (2006.01) | |

(52) U.S. Cl.
CPC .......... *B41F 15/44* (2013.01); *B41F 23/0456* (2013.01); *H01L 24/27* (2013.01); *H01L 24/83* (2013.01); *H01L 2224/2732* (2013.01); *H01L 2224/83192* (2013.01)

(58) Field of Classification Search
None
See application file for complete search history.

(56) References Cited

U.S. PATENT DOCUMENTS

| | | | |
|---|---|---|---|
| 9,670,371 B2 | 6/2017 | Pervan et al. | |
| 10,074,860 B2 | 9/2018 | Barnwell et al. | |
| 2005/0190248 A1 | 9/2005 | Konno et al. | 347/102 |
| 2012/0062666 A1 | 3/2012 | Roof et al. | 347/102 |
| 2017/0104225 A1* | 4/2017 | Barnwell | H01M 8/0273 |
| 2019/0329321 A1* | 10/2019 | Holt | B33Y 10/00 |

FOREIGN PATENT DOCUMENTS

| | | | |
|---|---|---|---|
| GB | 2100193 A | | 12/1982 |
| JP | 2005-150462 A | | 6/2005 |
| JP | 2005-167100 A | | 6/2005 |
| JP | 2010-251498 A | | 11/2010 |
| JP | 2020131463 A | * | 8/2020 |
| KR | 10-2016-0136372 A | | 11/2016 |
| TW | 201340126 A | | 10/2013 |
| WO | WO 2013/099521 A1 | | 7/2013 |

* cited by examiner

*Primary Examiner* — Joshua D Zimmerman
(74) *Attorney, Agent, or Firm* — OSTROLENK FABER LLP

(57) ABSTRACT

A method for producing a flat feature on a substrate, comprises the steps of printing a deposit of print medium onto the substrate, the printed deposit comprising an upper surface, modifying the upper surface of the printed deposit, for example by partially drying the printed deposit, and levelling the modified deposit to produce a flat feature.

16 Claims, 6 Drawing Sheets

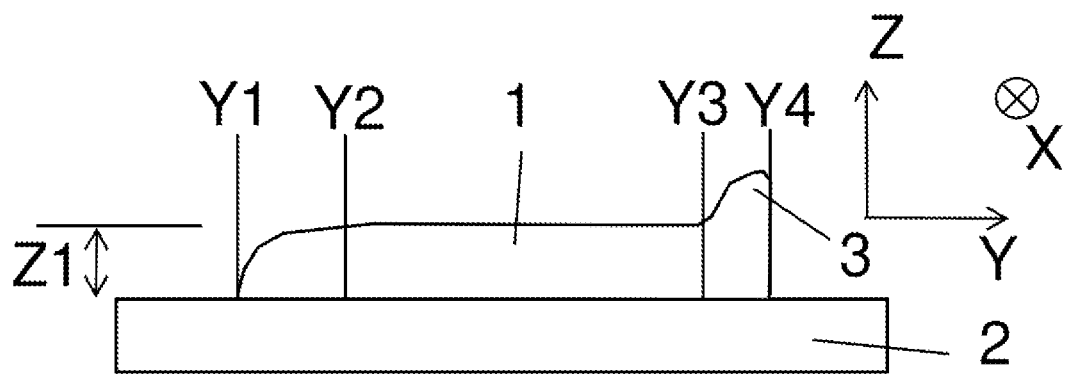
FIG. 1 - Prior art
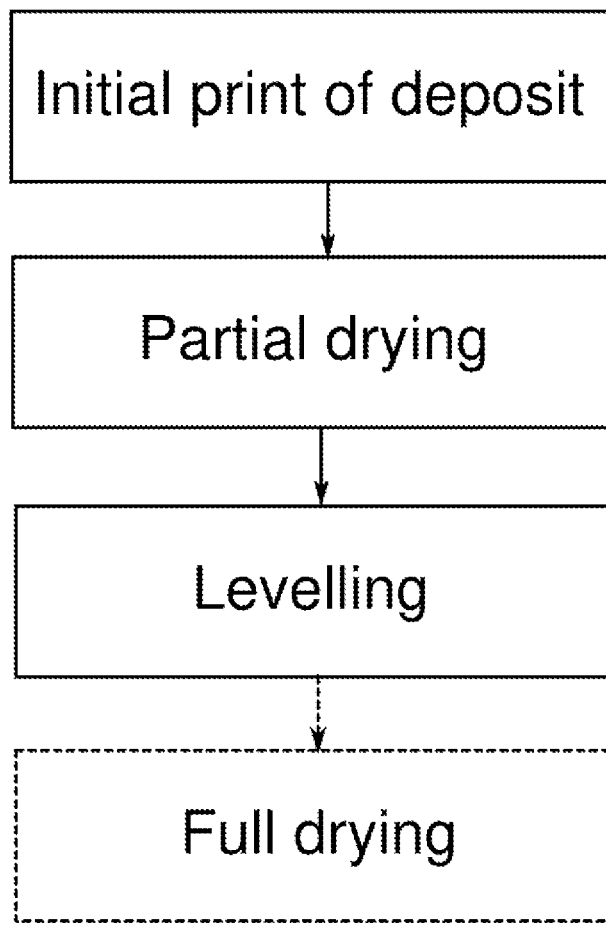
FIG. 2

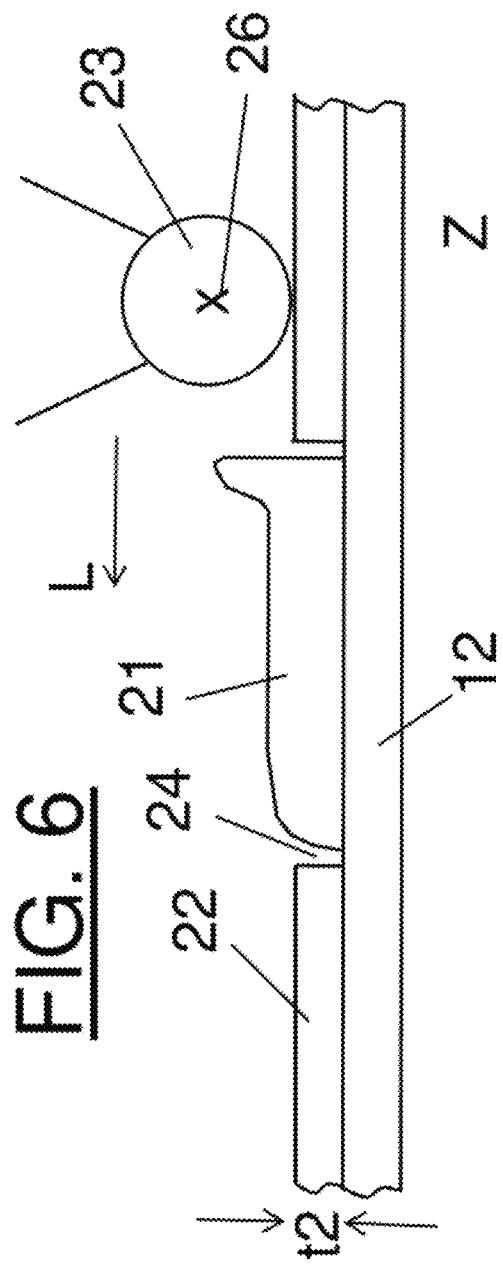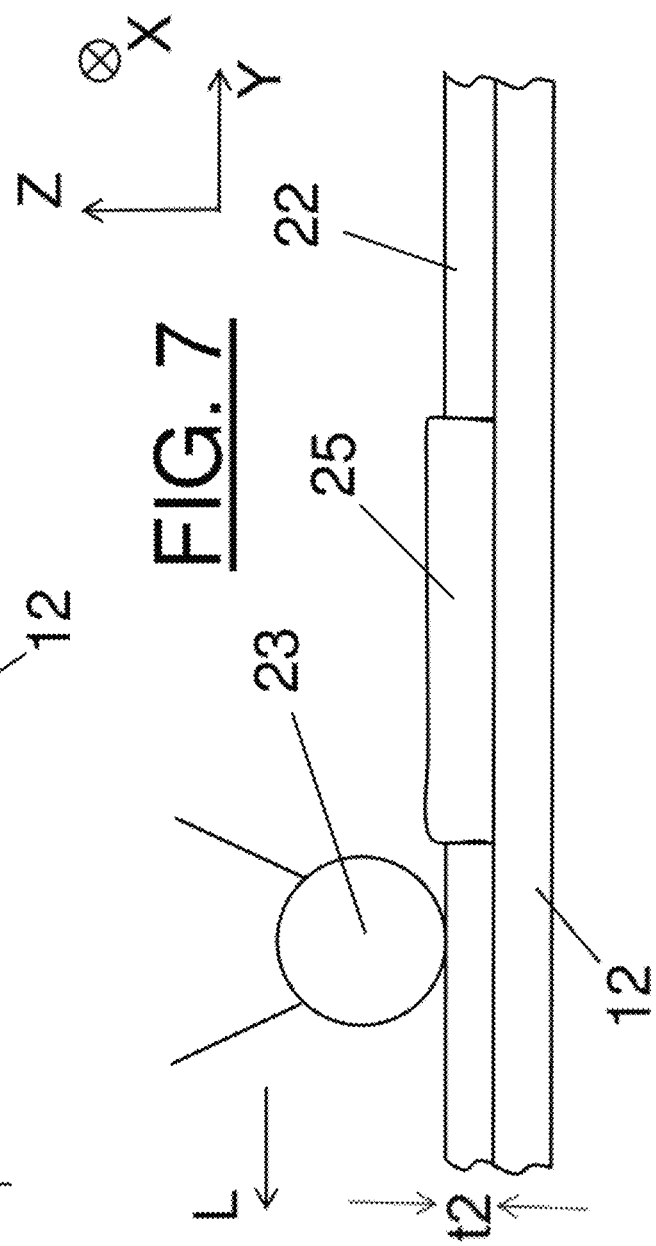

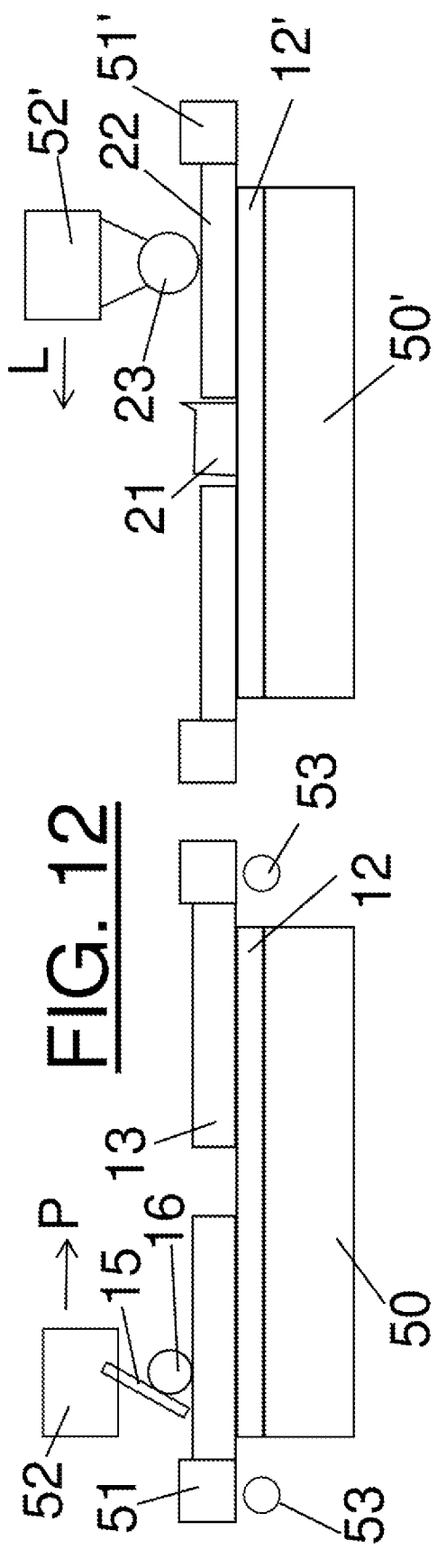
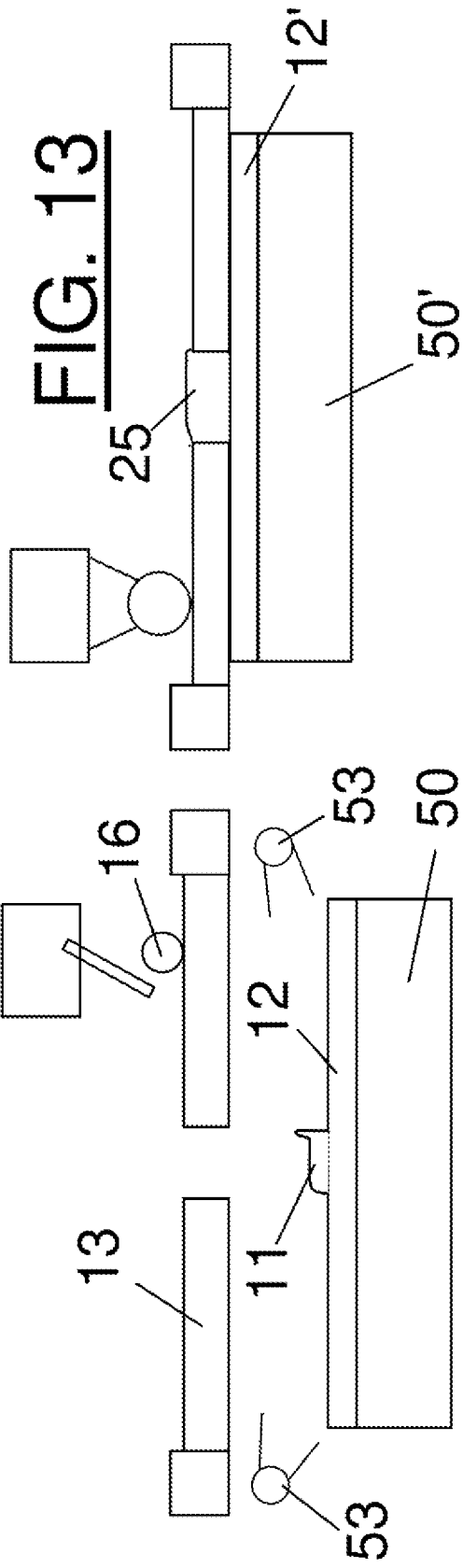

DEPOSIT LEVELLING

This invention relates to a method for producing a flat feature on a substrate, apparatus for performing such a method, a production line and a printing machine.

BACKGROUND AND PRIOR ART

Currently, various techniques exist for attaching dies to substrates in semiconductor applications. For example, it is known to stamp a die film onto a substrate, using dedicated equipment. While such a stamping process can produce high-quality results, the equipment cost is high. There is a need within the semiconductor industry to provide alternative techniques using cheaper equipment. One such alternative is, instead of stamping, to use a printing machine to print an Ag (silver) deposit onto a substrate. In more detail, such a known process typically includes the following stages:

i) A printing machine is used to print a silver deposit onto a substrate, using a patterned stencil to accurately locate the deposit;
  ii) The printed deposit is subjected to a drying process, advantageously in an $N_2$ (nitrogen) environment to prevent oxidation. Typically, the substrate is placed into a smart oven which can provide the $N_2$ environment and heated to about 120° C., and maintained around this temperature for about 20 to 30 minutes;
  iii) A "hot die placement" process is used to place the die onto the dried deposit, using bonding temperatures of around 250° C. A dedicated machine is used for this step; and
  iv) The substrate is subjected to a sintering process, which is usually performed at an increased pressure in a so-called "pressure sintering" process. Typically maximum pressures of around 30 MPa are used, at a temperature up to 300° C. This sintering step is typically performed either in a vacuum or in an $N_2$ environment to prevent oxidation. This step generally takes place within a dedicated machine, such as the Silver-SAM produced by ASM Assembly Systems.

Such a process is typically cheaper than a stamping process, since the initial printing step can be performed by a relatively inexpensive printing machine. However, it has been recognised that the printing process is difficult to perform, and is not suitable for all applications. As is well-known in the art per se, a printing process involves placing a patterned stencil over a substrate, placing print medium (in this case silver sintering paste) onto the stencil, then impelling the print medium through apertures in the stencil by scraping an angled squeegee blade across the top of the stencil. The stencil is then lifted off from the substrate, leaving print medium on the substrate in deposits corresponding to the apertures in the stencil. However, as schematically shown in FIG. 1, the silver sintering paste deposit 1, shown here in section with the underlying substrate 2, may suffer from non-uniform flatness across its horizontal extent in the printing direction, i.e. the direction of squeegee travel. As can be seen, while the central extent of the deposit (between points Y2 and Y3) may be flat with a consistent upper surface height of Z1, the leading edge of the deposit 1 (between points Y1 and Y2) may be lower than Z1, while the trailing edge of the deposit 1 (between points Y2 and Y3) may be significantly higher than Z1, with this characteristic raised feature being known as a "dog-tail" or "dog-ear" 3. Attaching a die onto a non-flat surface, particularly raised as with a dog-ear, can lead to cracking of the die, which is clearly undesirable. Ideally, to prevent cracking the die should be attached to a surface which has a flatness profile such that height deviations are minimized across the surface. A current target is to achieve a flatness profile with height deviations equal to or less than 10 µm across the surface. As such, a printed deposit such as that shown in FIG. 1 can only safely be used as a base for a die which is of maximum horizontal extent Y3-Y2, within normal tolerances. This means that the deposits may be about 25% bigger in the horizontal extent than the die. This both wastes print medium, and imposes a limit on the minimum horizontal separation of adjacent dies on a common substrate.

The present invention seeks to overcome these problems, and methodology and apparatus for producing features of printed deposits with improved flatness across their horizontal extent, and in particular which are sufficiently flat to enable dies to be safely attached thereto.

In accordance with the present invention, this aim is achieved by using a three-step process including an intermediate surface modification step.

SUMMARY OF THE INVENTION

In accordance with a first aspect of the present invention there is provided a method for producing a flat feature on a substrate, comprising the steps of:
  i) printing a deposit of print medium onto the substrate, the printed deposit comprising an upper surface,
  ii) modifying the upper surface of the printed deposit, and
  iii) levelling the modified deposit to produce a flat feature.

In accordance with a second aspect of the present invention there is provided apparatus for performing the method of the first aspect.

In accordance with a third aspect of the present invention there is provided a
production line comprising a plurality of operation modules, said operation modules comprising a surface modification module, and at least one printing machine, the production line further comprising a transfer mechanism for transferring a workpiece between the operation modules, the production line being arranged such that a workpiece that has been printed by a printing machine may be transferred by the transfer mechanism from the printing machine to the surface modification module to undergo a surface modification process, and subsequently transferred from the surface modification module to a printing machine to undergo a levelling operation.

In accordance with a fourth aspect of the present invention there is provided a printing machine for printing a print medium onto a workpiece in a printing operation, the printing machine comprising a heater for at least partially drying the printed print medium.

Other specific aspects and features of the present invention are set out in the accompanying claims.

BRIEF DESCRIPTION OF THE DRAWINGS

The invention will now be described with reference to the accompanying drawings (not to scale), in which:

FIG. 1 schematically shows, in sectional side view, a deposit of silver sintering paste which has been printed onto a substrate in a conventional print process;

FIG. 2 shows a flowchart setting out a process for producing flat features in accordance with an embodiment of the present invention;

FIG. 6 schematically shows, in sectional side view, a levelling process immediately before levelling of the deposit;

FIG. 7 schematically shows, in sectional side view, a levelling process immediately after levelling of the deposit;

FIGS. 12 and 13 schematically show, in a sectional side view, interior details of a printing machine which is able to perform both the initial printing step i), the partial drying step ii) and the levelling step iii).

DETAILED DESCRIPTION OF THE PREFERRED EMBODIMENTS OF THE INVENTION

A flowchart setting out a basic process for producing flat features in accordance with an embodiment of the present invention is shown in FIG. 2. In accordance with the present invention, there are three main steps:
i) initially, a deposit of print medium is printed onto a substrate,
ii) the upper surface of the printed deposit is modified, for example by being partially dried as shown in the embodiment of FIG. 2, and
iii) the modified deposit is levelled to produce a flat feature.

FIG. 2 also shows a fourth step:
iv) the flat feature is dried.

While this fourth step will be essential for many applications, it is foreseeable that the flat feature produced by the end of the third step above could also be of practical utility without undergoing the drying step. Furthermore, full drying of deposits/features is already carried out with the known processes described in the background section, and there are various ways this could be achieved. The present invention is therefore considered to relate mainly to the first three steps, with the fourth step being an optional but usual follow-on process.

Figure 3:
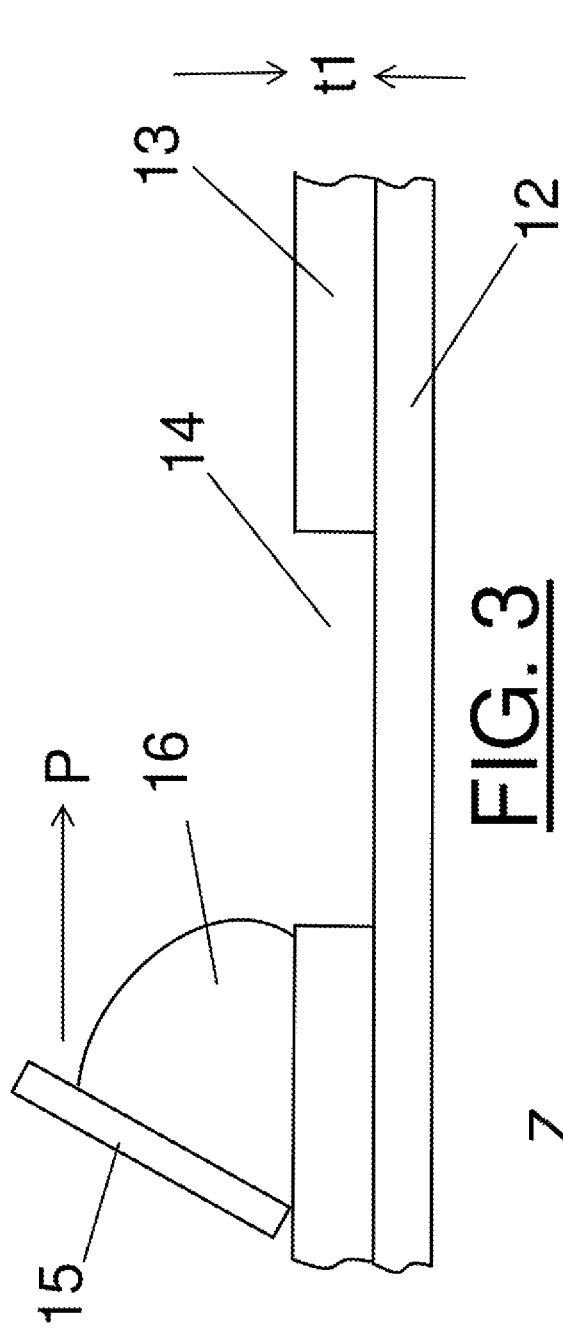
FIG. 3 schematically shows, in sectional side view, an initial printing process immediately before printing of a deposit.
Figure 4:
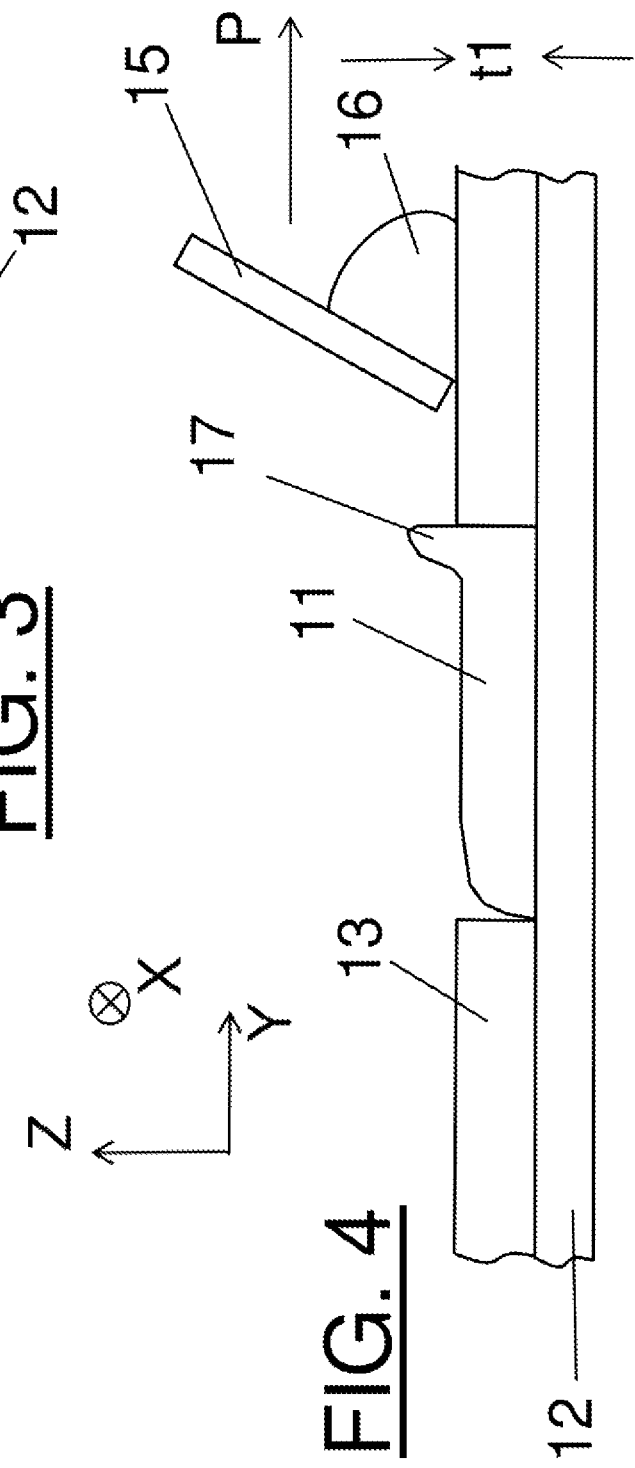
FIG. 4 is similar to FIG. 3, showing the initial printing process immediately following printing of the deposit.

FIG. 3 schematically shows, in sectional side view, an initial printing process of the first step, immediately before printing of a deposit 11 of silver sintering paste, with FIG. 4 being similar to FIG. 3, but showing the process immediately following printing of the deposit 11.

In FIG. 3, a substantially planar substrate 12 is shown being located within a printing machine. Although not visible in FIG. 3, as is well-known in the art per se the substrate 12 is supported from below by tooling located within the printing machine so that it is kept both as flat as possible, and with its upper surface as parallel to the horizontal X-Y plane as possible. At the commencement of a printing operation, the substrate 12 is moved up into contact with a printing stencil 13, which could comprise a sheet of metal such as stainless steel or nickel, or alternatively a mesh of woven metal filaments. The printing stencil 13 is patterned to include at least one aperture 14 corresponding in shape and position to the intended feature to be formed on the substrate 12, however of slightly smaller horizontal dimension than the intended feature, as will be described in more detail below. A mass of print medium, in this case silver sintering paste, is supplied to the upper surface of the printing stencil 13, and then pushed over the surface by an angled squeegee blade 15 travelling in a printing direction P parallel to the Y axis shown. As is well-known per se, the squeegee blade 15 may be carried by a print carriage (not shown) movably suspended from a gantry (not shown) within the printing machine. The print medium will tend to form a roll 16 of material at the leading edge of the squeegee blade 15. The squeegee blade 15 is typically angled with respect to the printing stencil 13, for example at an angle of between 50° and 70°, so that movement of the squeegee blade 15 in printing direction P imparts both a horizontal and downward force to the roll 16, so that the print medium is impelled into the aperture 14 and on to the substrate 12 as the squeegee blade 15 passes over it. As shown in FIG. 4, the deposit 11 of print medium has a similar profile to that shown in FIG. 1, including the characteristic dog-ear 17 at its trailing edge. In more detail, if the printing stencil 13 has a thickness t1 as shown, the majority of the deposit 11 will have a thickness at or slightly below t1, but with a dog-ear 17 of greater thickness (>t1) and therefore projecting out past the top of the aperture 14, and in addition the leading edge of the deposit 11 may be of somewhat lower thickness than t1 as shown. It has been found experimentally that using a printing stencil with a thickness of t1 between 100 μm and 200 μm, optionally between 125 μm and 175 μm, optionally around 150 μm, may produce optimal results.

Following this printing operation, the substrate 12 is lowered away from the printing stencil 13, leaving the deposit 11 on top of the substrate 12.

In the second step, the upper surface of the printed deposit 11 is modified to reduce its tackiness, and in the present embodiment this is achieved by partially drying the deposit 11 in a baking process. This may be achieved in various ways, as outlined further below. However, in one embodiment, schematically shown in FIG. 5, the substrate 12 with deposit 11 is transferred out from the printing machine to a separate oven module 17 within the same production line as the printing machine, via a transfer mechanism (not shown in FIG. 5) such as one or more conveyors, which are typically used to transport workpieces between modules of production lines. The oven module 17 shown in FIG. 5 includes a number, here three, of infra-red lamps 18 which are operative to apply infra-red illumination to the deposit 11 and hence raise its temperature. The aim of step ii) is to partially dry the deposit 11, i.e. to dry the outer surface of the deposit 11 while leaving the interior of the deposit 11 soft. Experimentally it has been found that this may be achieved by heating the deposit to a temperature in the range 50° C. to 200° C., optionally in the range 100° C. to 200° C., optionally in the range 125° C. to 175° C., optionally in the range 140° C. to 160° C., optionally around 150° C. The deposit may be heated for a time period in the range 30 seconds to 10 minutes, optionally in the range 1 minutes to 5 minutes, optionally around 2 minutes.

Figure 5:
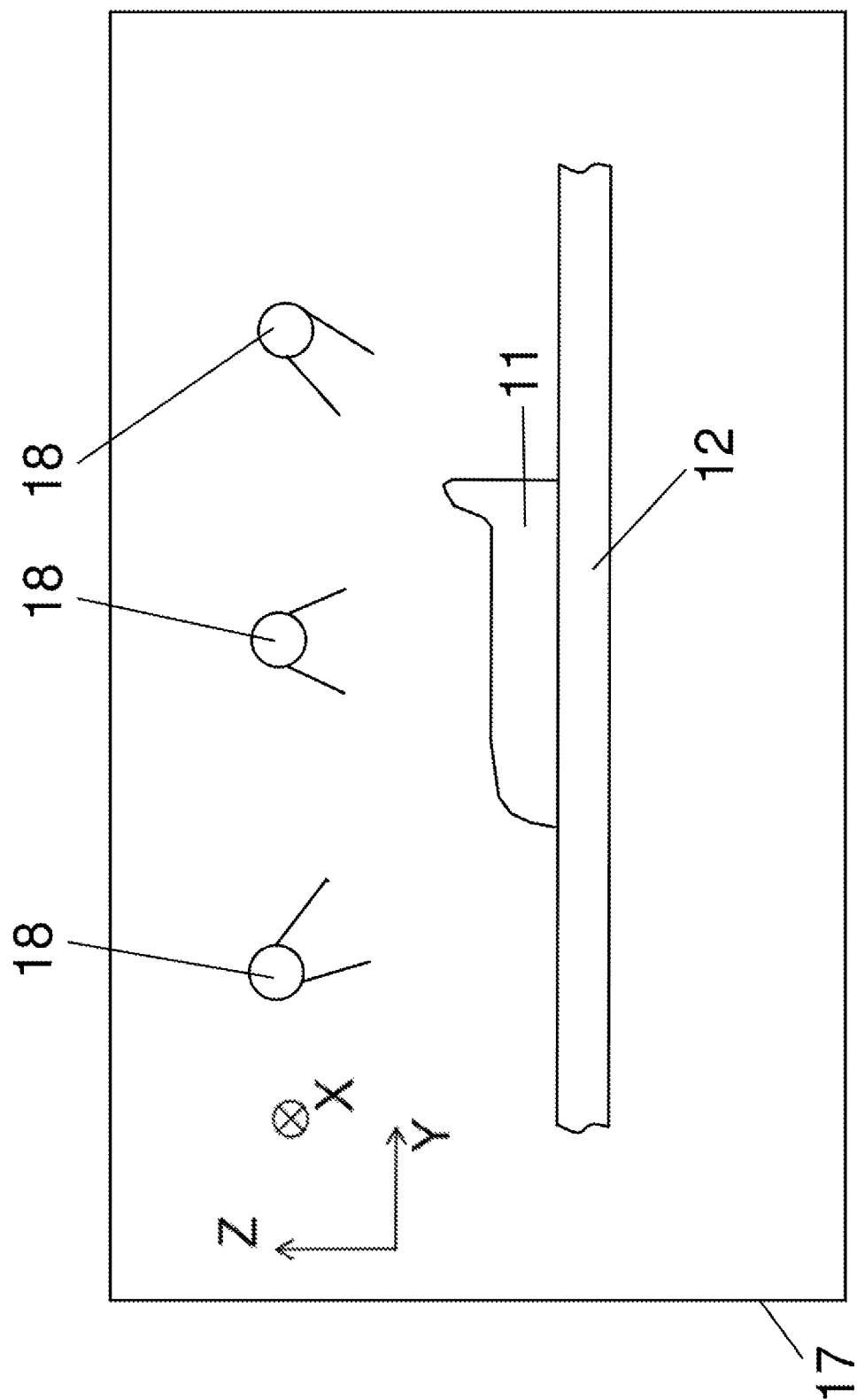
FIG. 5 schematically shows, in sectional side view, the deposit being partially dried in an oven module.

While in FIG. 5 the oven module 17 uses infra-red lamps 18 as heating elements, heating of the deposit 11 may of course be performed in various ways, for example using convective heating rather than radiative heating, including using an air impingement process in which heated jets of gas (not necessarily air, but also substantially inert gases such as nitrogen may be used) are directed at the deposit 11, as is known in the art per se. In fact, in the case of air impingement processes, the upper surface of the printed deposit could be dried to sufficiently reduce its tackiness by applying unheated jets of gas.

In step iii), the modified, i.e. in this embodiment partially-dried, deposit is levelled to produce a flat feature. To achieve this, the substrate 12 with its partially-dried deposit 21 is transferred out from the oven module 17 to a printing machine within the same production line as the oven module, via the transfer mechanism. As described in more detail below, this could be a separate printing machine dedicated to performing levelling operations, or alternatively could be the same printing machine which performed step i), if the printing machine is adapted to perform both the printing and levelling operations. The levelling operation is schematically shown in FIGS. 6 and 7, with FIG. 6 showing the partially-dried deposit 21 immediately before levelling, and FIG. 7 showing the partially-dried deposit 21 immediately following levelling. As in step i), the substrate 12 is supported within the printing machine by tooling (not shown) to maintain flatness and parallelism with the horizontal X-Y plane. The substrate 12 is moved up and into contact with a levelling stencil 22, which may be of generally similar construction to the printing stencil 13 described previously with respect to FIG. 3, however the thickness t2 of levelling stencil 22 is made thinner than the thickness t1 of the printing stencil 13, i.e. t2<t1. It has been found experimentally that using a levelling stencil with a thickness of t2 between 50 μm and 150 μm, optionally between 70 μm and 100 μm, optionally around 80 μm, can produce satisfactory results. The levelling stencil 22 is patterned with at least one aperture 24 which corresponds to the final shape, dimension and position of the intended feature 25 (see FIG. 7). As can be seen in FIG. 6, the aperture 24 of the levelling stencil 22 is slightly bigger in horizontal extent than the aperture 14 of the printing stencil 13, which creates air gaps around the partially-dried deposit 21. To effect levelling, a levelling squeegee 23, which suitably may be mounted on a print carriage (not shown), is moved across the top surface of the levelling stencil 22 in a levelling direction L, to contact the upper surface of the partially-dried deposit 21. Since the tackiness of the upper surface is reduced through the previous surface modification through partial-drying step ii), the deposit material does not stick to the levelling squeegee 23. As shown, the levelling direction L is in the opposite direction to the printing direction P, which arrangement has been found to produce optimal levelling. However, this is not essential, and satisfactory levelling may still be obtained using processes in which L and P have the same direction. Levelling squeegee 23 is shown in the form of a rotatably-mounted bar with a curved-profile edge, which can rotate and therefore roll about a horizontal rotation axis 26 parallel to the X axis, so that it can flatten the partially-dried deposit 21 in a similar manner to a kitchen rolling pin. It should be understood that use of a rotatably-mounted bar as the levelling squeegee is not essential, and indeed a high standard of levelling has been achieved experimentally using a non-rotatable bar with a curved-profile edge, such as the "roll-bar squeegee" produced by ASM. As noted above, since the partially-dried deposit 21 has a dry outer surface, sticking of the print medium to the levelling squeegee 23 is prevented, while the soft interior of the partially-dried deposit 21 allows it to be deformed and flattened without cracking or other damage. As can be seen from FIG. 7, the feature 25 formed is substantially flat, and is spread out to fill the aperture 24. Depending on the relative sizes of the printing aperture 14 and levelling aperture 24, the feature 25 may have its upper surface at, or, as shown in FIG. 7, slightly projecting above the upper surface of the levelling stencil 22. Following levelling, the substrate 12 is lowered away from the levelling stencil 22, leaving the feature 25 on the substrate 12. The substrate 12 may then be transferred or transported where required for the particular application.

In most cases, it is envisaged that the substrate 12 and its feature 25 will proceed to a final step iv) of baking the feature 25 to fully dry it. This step may conveniently be performed in a conventional production line oven module, optionally in the same oven module 17 as shown in FIG. 5, for example using radiative heating techniques with, for example, infra-red lamps, or a convective heating system. It has been found experimentally that heating the feature to a temperature in the range 100° C. to 200° C., optionally in the range 125° C. to 175° C., optionally in the range 140° C. to 160° C., optionally around 150° C. produces satisfactory results. Furthermore, it has been found that heating the flat feature for a time period in the range 4 minutes to 15 minutes, optionally in the range 6 minutes to 10 minutes, optionally around 8 minutes produces satisfactory results. The fully-dried feature this produced may then be used as required for the particular application. For example, a die may be attached to the feature, and then a pressure sintering step performed, which steps are known in the art per se.

FIGS. 8 to 11 schematically show exemplary production line set-ups suitable for performing the methodology of the present invention. In these figures, each rectangular block represents a different module of the production line, with arrows showing the transfer of workpieces (i.e. substrates, substrates with a deposit printed thereon or substrates with a feature formed thereon) through the production line.

Figure 8:
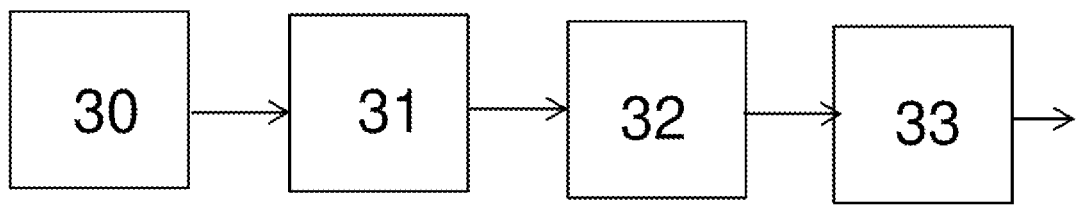
FIGS. 8 to 11 schematically show production line set-ups suitable for performing the methodology of the present invention.

FIG. 8 shows a simple linear production line set-up. Module 30 is a printing machine set-up to perform the initial printing step i). Module 31 is a surface modification module, in this embodiment an oven module adapted to perform the surface modification through partial-drying step ii). Module 32 is a printing machine set-up to perform the levelling step iii). Finally, module 33 is an oven module adapted to perform the full-drying step iv).

Figure 9:
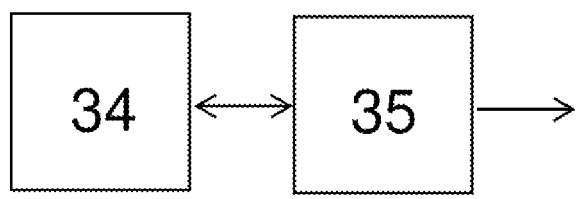

FIG. 9 shows a set-up with reduced footprint. Module 34 is a printing machine which is able to perform both the initial printing step i) and the levelling step iii). Module 35 is an oven module which is operative to perform both the surface modification through partial-drying step ii) and the full-drying step iv). In practice, a workpiece is shuttled between these modules to performs all the steps, i.e. a deposit is printed in module 34, transferred to module 35 for partial-drying, then transferred back to module 34 for levelling, followed by a final transfer to module 35 for full-drying.

Figure 10:
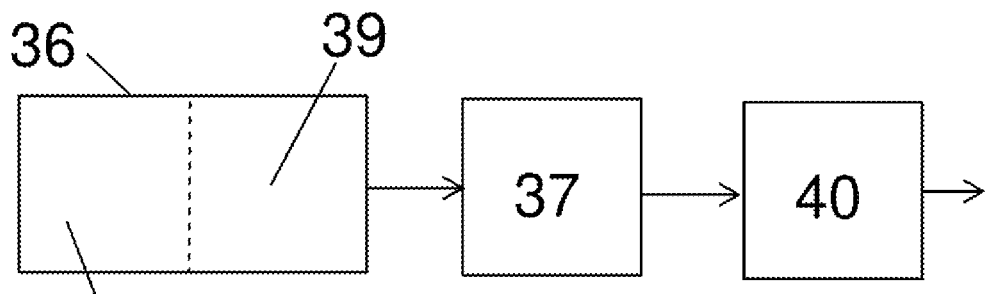

FIG. 10 shows a set-up with a small footprint and reduced shuttling as compared to that shown in FIG. 9. Module 36 is a combined print and oven module, with a print unit 38 and oven unit 39. The print unit 38 is adapted to perform the initial print step i), while the oven unit 39 is adapted to perform the surface modification through partial-drying step ii). This may be realised by, for example, retrofitting at least one infra-red lamp to an existing printing machine, which may be illuminated to heat the substrate as soon as the printing step i) has completed, while the substrate remains supported on the tooling. Module 37 is a printing machine adapted to perform the levelling step iii). Module 40 is an oven module adapted to perform the full-drying step iv).

Figure 11:
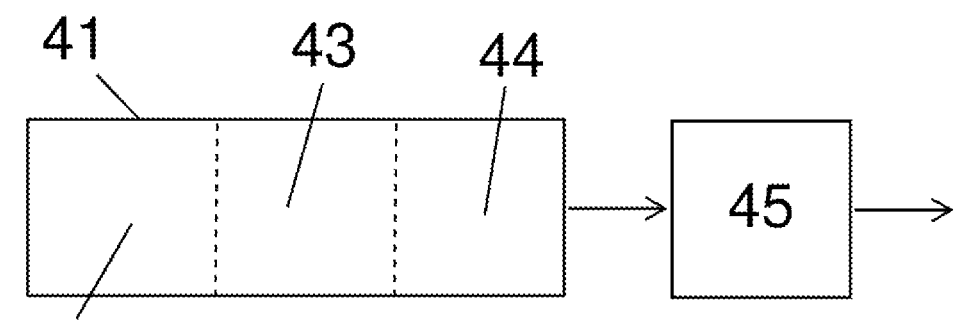

FIG. 11 shows a set-up with a module 41 which is combined print and oven module with print unit 42 adapted to perform the initial print step i), an oven unit 43 for performing the surface modification through partial-drying step ii), and a levelling unit 44 operative to perform the levelling step iii). Module 41 will be described in more detail below with respect to FIG. 12. Module 45 is an oven module adapted to perform the full-drying step iv).

FIG. 12 schematically shows, in a sectional side view, interior details of a printing machine which set up to perform both the initial printing step i), the surface modification through partial drying step ii) and the levelling step iii). As shown, the printing machine has a large interior, so that it can house two separate printing areas—effectively the interior workings of two separate printing machines are combined into a single printing machine frame. On the left hand side as shown is a printing set-up for performing step i). A substrate 12 is supported on tooling 50, which as is well-known in the art per se is supported on a rising table (not shown) which can move vertically to bring the substrate 12 towards or away from a printing stencil 13. The printing stencil 13 is held in a tensioned state within a tensioning frame 51, such as the well-known VectorGuard® tensioning frame for example. Squeegee blade 15 is mounted to a printing carriage 52 for movement therewith. Positioned underneath the printing stencil 13 are infra-red lamps 53, which are shown switched off. On the right hand side as shown is a levelling set-up for performing step iii). A substrate 12' is supported on tooling 50', which again is supported on a rising table (not shown). The levelling stencil 22 is held in a tensioned state within a tensioning frame 51'. Levelling squeegee 23 is mounted to a printing carriage 52' for movement therewith.

FIG. 13 schematically shows the printing machine of FIG. 12 during the surface modification through partial drying step ii). Tooling 50 and the substrate 12 are lowered away from the printing stencil 13. This action brings the freshly-printed deposit 11 into line of sight with the infra-red lamps 53, which are shown switched on. Partial drying of the deposit 11 can occur in situ.

Following completion of the partial drying step ii), and once any substrate 12' with a feature 25 has been transferred away from the tooling 50', the substrate 12 with its partially-dried deposit can be transferred to the tooling 50' on conveyors (not shown), which may conveniently be constructionally similar to those commonly used in the art to effect input and output of workpieces to and from printing machines.

Of course, there are various ways of implementing such a printing machine, for example the infra-red lamps could be placed in a variety of locations. In particular, they may be placed in association with the levelling set-up, in which case a freshly-printed substrate 12 with deposit 11 could be transferred to tooling 51' subsequent to completion of step i), then the surface modification through partial drying step ii) could take place while the substrate is supported by tooling 51', prior to levelling. In a yet further possibility, an oven module could be provided between the printing and levelling set-ups, so effectively the interior workings of two separate printing machines and an oven module are combined into a single printing machine frame. Other types or arrangements of heater are also possible, such as convective heating means.

Similarly, the combined print and oven module 36, as shown in FIG. 10, could comprise a printing set-up with integrated heating elements as shown in the left side of FIGS. 12 and 13, while the levelling set-up shown in the right hand side could be located in a separate printing module 37.

Of course, it is also possible to provide a printing machine module similar to that shown in FIG. 12 but omitting the heating elements. In this case, a workpiece may be transferred to a separate oven module following the initial printing step i), undergo the surface modification through partial drying step ii) then be transferred to the levelling set-up of the printing machine module to undergo levelling step iii).

The above-described embodiments are exemplary only, and other possibilities and alternatives within the scope of the invention will be apparent to those skilled in the art. For example, while the above-described embodiments have focused on surface modification of the printed deposit through air-drying, other techniques may be used to modify the surface to reduce its tackiness. For example, a photochemical treatment process may be applied to the printed deposit to alter the surface chemistry and so reduce tackiness. It may also be possible to combine the aforementioned surface modification processes, for example a combination of two or more of infra-red heating, convection heating, air impingement and photochemical treatment processes could be employed in step ii).

REFERENCE NUMERALS USED

1—Silver sintering paste deposit
2—Substrate
3—Dog-ear
11—Deposit
12, 12'—Substrate
13—Printing stencil
14—Aperture
15—Squeegee blade
16—Roll
17—Oven module
18—Infra red lamps
21—Partially-dried deposit
22—Levelling stencil
23—Levelling squeegee
24—Aperture
25—Feature
26—Rotation axis
30, 32, 34, 37—Printing modules
31, 33, 35, 40, 45—Oven modules
36, 41—Combined print and oven modules
38, 42—Print unit
39, 43—Oven unit
44—Levelling unit
50, 50'—Tooling
51, 51'—Tensioning frame
52, 52'—Print carriage
53—Infra-red lamps
P—Printing direction
L—Levelling direction
t1—Thickness of printing stencil
t2—Thickness of levelling stencil

The invention claimed is:

1. A method for producing a flat feature on a substrate, comprising the steps of:
   i) printing a deposit of print medium onto the substrate, the printed deposit comprising an upper surface,
   ii) modifying the upper surface of the printed deposit, and
   iii) levelling the modified deposit to produce a flat feature, wherein step iii) comprises performing a levelling operation in which a levelling squeegee is moved across a levelling stencil to contact the modified upper surface of the printed deposit.

2. The method of claim 1, wherein step ii) comprises partially drying the printed deposit.

3. The method of claim 2, wherein step ii) comprises heating the deposit to a temperature in the range 50° C. to 200° C.

4. The method of claim 2, wherein step ii) comprises heating the deposit for a time period in the range 30 seconds to 10 minutes.

5. The method of claim 2, wherein step ii) comprises heating the deposit by applying infra-red illumination to the deposit, using convection heating or heating using an air impingement process.

6. The method of claim 1, wherein step ii) comprises treating the printed deposit using an air impingement process or a photochemical treatment process.

7. The method of claim 1, wherein step i) comprises placing a printing stencil onto the substrate, the printing stencil having a thickness t1 and at least one print aperture, placing the print medium onto the printing stencil, and moving a squeegee blade across the printing stencil to impel the print medium through the at least one print aperture.

8. The method of claim 2, wherein in step iii) the levelling squeegee is moved across the levelling stencil to contact an upper surface of the partially-dried deposit.

9. The method of claim 1, wherein the levelling stencil has a thickness t2, which is smaller than t1.

10. The method of claim 8, wherein the levelling squeegee comprises a curved-profile edge; optionally the levelling squeegee comprises a rotatably-mounted bar.

11. The method of claim 1, comprising the subsequent step of:
iv) baking the flat feature to dry it.

12. The method of claim 11, wherein step iv) comprises heating the flat feature to a temperature in the range 100° C. to 200° C.

13. The method of claim 11, wherein step iv) comprises heating the flat feature for a time period in the range 4 minutes to 15 minutes.

14. The method of claim 1, wherein the print medium comprises silver sintering paste.

15. A production line comprising a plurality of operation modules, said operation modules comprising a surface modification module, and at least one printing machine, the production line further comprising a transfer mechanism for transferring a workpiece between the operation modules, the production line being arranged such that a workpiece that has been printed by a printing machine may be transferred by the transfer mechanism from the printing machine to the surface modification module to undergo a surface modification process, and subsequently transferred from the surface modification module to a printing machine to undergo a levelling operation in which a levelling squeegee is moved across a levelling stencil to contact the modified upper surface of the workpiece.

16. The production line of claim 15, wherein the surface modification module comprises an oven.

* * * * *